United States Patent [19]

Iten et al.

[11] 3,747,025

[45] July 17, 1973

[54] ELECTRICAL FILTER CIRCUIT

[75] Inventors: Paul Iten, Oberrohrodorf; Jiri Mastner, Niederrohrdorf, both of Switzerland

[73] Assignee: Brown, Boveri & Cie, Aktiengesellschaft Patentableilung, Baden, Switzerland

[22] Filed: Sept. 27, 1971

[21] Appl. No.: 184,023

[30] Foreign Application Priority Data

Sept. 28, 1970 Switzerland .......... 14316/70

[52] U.S. Cl. .......... 333/17, 328/140, 328/167

[51] Int. Cl. .......... H03h 7/10

[58] Field of Search .......... 328/138, 140, 141, 328/150, 167; 333/17, 70 R

[56] References Cited

UNITED STATES PATENTS

| | | | |
|---|---|---|---|
| 1,968,460 | 7/1934 | Llewellyn | 333/17 UX |
| 3,022,471 | 2/1962 | Mark | 333/17 |
| 3,611,165 | 10/1971 | Hills | 328/138 X |

*Primary Examiner*—Paul L. Gensler
*Attorney*—W. G. Fasse

[57] ABSTRACT

The present electrical filter circuit has a plurality of filter paths connected in parallel to each other between an input and an output. At the input side of each path there is arranged a bandpass filter which is then followed by logic circuit and bypass means interconnected in such a manner that only one path at a time is closed to the exclusion of all other paths in response to the signal level at the output of the respective bandpass filter means.

6 Claims, 1 Drawing Figure

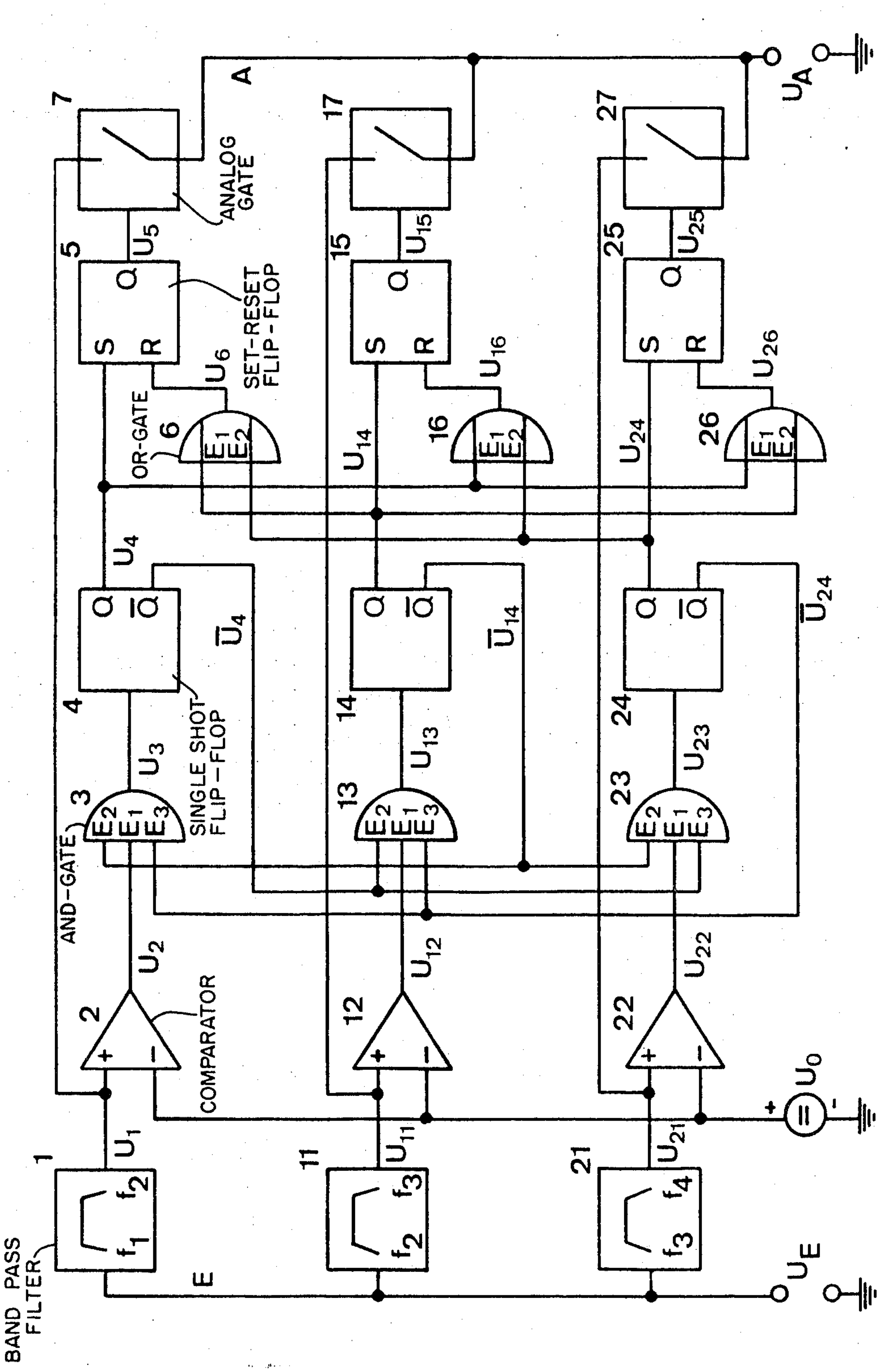
BAND PASS FILTER
COMPARATOR
AND-GATE
SINGLE SHOT FLIP-FLOP
OR-GATE
SET-RESET FLIP-FLOP
ANALOG GATE
A
E
U_A
U_E
U_0

ELECTRICAL FILTER CIRCUIT

BACKGROUND OF THE INVENTION

The invention relates to an electrical filter circuit wherein at least two bandpass filters are connected in parallel at the input side and having different pass-characteristics.

Such electrical filter circuits are mainly used in high- and low-frequency techniques, in electronics generally and in testing as well as in measuring. Especially in measuring the problem frequently arises to filter out the useful signal from a mixture of frequencies and to feed it undistorted to a processing device. Numerous devices have been proposed for solving this problem. However, all these devices fail if the frequency of the useful signal is not known initially, or if the frequency-range of the useful signal may extend over several decades. Thus, it has been suggested in connection with so-called filter-banks to divide the frequency range of the useful signal into individual partial ranges, for example by bandpass filters with mutually overlapping edge-frequencies. Then that bandpass filter which passes the useful signal is connected to the processing device. However, if the frequency of the useful signal is not known, the magnitude of the amplitude at the bandpass filter outputs has been used as an indication for manually or automatically connecting a respective filter.

In the devices known, the output voltages of the individual filters are rectified and smoothed by auxiliary filters to obtain the desired information whether a signal is present. This manner of signal processing becomes, however, rather unfeasible as soon as the frequency range to be covered exceeds one decade and fast variations of signal frequency are to be expected. Namely, to smooth out the ripple caused by lower frequencies, the time constant of the filter must be large and thus makes the switching rate very slow.

OBJECTS OF THE INVENTION

In view of the foregoing, it is the aim of the invention to achieve the following objects singly or in combination:

to overcome the drawbacks of the prior art as outlined above, especially to provide a circuit arrangement which will filter with certainty the useful signal out of a frequency mixture covering a wide range of frequencies, whereby signal disturbances are to be avoided even if the input signal bears a strong statistical modulation, e.g., where the input signals are Laser-Doppler radar signals;

to provide a circuit arrangement which will properly operate even if the frequency of the useful signal is unknown, its amplitude statistically varying, and even if the frequency of the useful signal may be anywhere within or sweep rapidly through a wide range, for example, one extending over several decades;

to provide a filter circuit which will automatically connect anyone of a plurality of input bandpass filter means to a common output bus terminal without excessive time loss or delay;

to assure an automatic interconnection of but one of a plurality of bandpass filter means to a common output bus terminal whereby simultaneously, all other interconnecting paths between such bandpass filter means and said common output bus terminal must be blocked; and to provide a switching circuit which evaluates the instantaneous voltages at the filter outputs rather than their envelopes to allow for a maximum tracking rate of the filter switching when the signal frequency changes rapidly.

SUMMARY OF THE INVENTION

According to the invention there is provided an electric filter circuit wherein any one of a plurality of bandpass filter means may be connected to a common output bus terminal by logic circuit means for controlling the transmission of the output voltage of any of said bandpass filter means in the pass range of which the input voltage has exceeded an adjustable threshold level, for blocking all other paths, and for restoring the readiness to transmit in response to the fact that the output voltage of the connected bandpass filter means has dropped below said threshold level.

DETAILED FIGURE DESCRIPTION

In order that the invention may be clearly understood, it will now be described, by way of example, with reference to the single FIGURE of the accompanying drawing which shows one embodiment of the invention comprising three bandpass filter means and the respective logic circuits according to the invention for automatically connecting said bandpass filter means to a common output bus terminal. It will be appreciated that the shown circuit arrangement may be extended by any number of bandpass filter means and that it may also be embodied by using but two bandpass filter means.

The input voltage $U_E$ is fed to the three parallel-connected inputs of the three bandpass filters 1,11,21. The edge-frequencies of the bandpass filter 1 are designated by $f_1$ and $f_2$, those of the bandpass filter 11 by $f_2$ and $f_3$, and those of the bandpass filter 21 by $f_3$ and $f_4$. Thus, the individual pass ranges overlap at the edge-frequencies. The bandpass filters may, for example, be of conventional construction, i.e., they may comprise passive elements such as inductances, capacities and ohmic resistances. However, it is advantageous to provide active RC filters (Elektronik 1970, No. 5, pp. 149–152).

The output of the first bandpass filter 1 is connected to the input of a first comparator 2, and through a bypass conductor to the input of a first analogue gate 7. The comparison input of the first comparator 2 is connected to a voltage source which provides, preferably, an adjustable threshold voltage $U_0$. The output of the first comparator 2 is connected to the first input $E_1$ of a first AND-gate 3. The output ($U_3$) of the first AND-gate 3 is connected to the input of a first retriggerable single-shot flip-flop 4. By a retriggerable single-shot flip-flop is meant a monostable multivibrator which is newly triggered by each pulse arriving durings its timing period, such as Fairchild TTμL 9601. The out-put (Q) of the first single-shot flip-flop 4 is connected to the input (S) of a first set-reset flip-flop 5, to the first input $E_1$ of a second OR-gate 16, and to the first input $E_1$ of a third OR-gate 26. The output (Q) of said first set-reset flip-flop 5 is connected to the control input of the first analog gate 7, the output of which is connected to the output bus terminal (A).

Furthermore, the output of a first OR-gate 6 is connected to the input (R) of said first set-reset flip-flop 5. The output ($\bar{Q}$) of said first single-shot flip-flop 4 is connected to the second input $E_2$ of a second AND-gate 13 and to the third input $E_3$ of a third AND-gate 23. The stages following the second and third bandpass filters comprise the same elements and are arranged in the same manner as the stage just described.

The output of the second bandpass filter 11 is connected to the input of a second comparator 12, and through a second by-pass conductor to the input of a second analog gate 17. The comparison input of the second comparator 12 is also connected to the same threshold voltage source $U_0$. The output of the second comparator 12 is connected to the first input $E_1$ of a second AND-gate 13. The output of this AND-gate 13 is connected to the input of a second single-shot flip-flop 14. The output (Q) of the single-shot flip-flop 14 is connected to the input (S) of a second set-reset flip-flop 15 to the first input $E_1$ of the first OR-gate 6, and to the second input of the third OR-gate 26. The output ($\overline{Q}$) of said second single-shot flip-flop 14 is connected to the second input $E_2$ of the first AND-gate 3 and to the second input $E_2$ of the third AND-gate 23. The output of the second OR-gate 16 is connected to the input (R) of the second set-reset flip-flop 15, the output of which is connected to the control input of the second analog gate 17. The output of this analog gate 17 is connected to the common output bus terminal (A) already mentioned.

The output of the bandpass filter 21 is connected to the input of a third comparator 22, the comparison input of which is connected to the comparison inputs of the other two comparators 2 and 12 and thus to the threshold voltage source $U_0$. The output of the filter 21 is further connected through a third by-pass conductor to the input of a third analog gate 27. The output of the comparator 22 is connected to the first input $E_1$ of the third AND-gate 23. The output of this AND-gate 23 is connected to the input of a third single-shot flip-flop 24 the output (Q) of which is connected to the input (S) of a third set-reset flip-flop 25. The output ($\overline{Q}$) of said third single-shot flip-flop 24 is connected to the third input $E_3$ of the first AND-gate 3 and to the third input $E_3$ of the second AND-gate 13. The input (R) of the third set-reset flip-flop 25 is connected to the output of the third OR-gate 26. The output (Q) of the third set-reset flip-flop 25 is connected to the control input of the third analog gate 27, the output of which is connected to the common output terminal (A).

In order to simplify the description of the operation of the circuit arrangement described above, the output voltages or output pulses of the block symbols are designated as follows. The output voltage or pulse of any circuit block (n) is $U_n$, the negation of the voltage or pulse $U_n$ is $\overline{U}_n$. The operation and structure of the blocks need not be described since they are known as such. It is assumed that in the inoperative state the voltages $U_1, \ldots, U_5, U_{11}, \ldots, U_{15}$ and $U_{21}, \ldots U_{25}$ are zero. Thus the voltage $U_A$ on the common output terminal (A) is also equal to zero. The input voltage $U_E$ on the common input terminal (E) is assumed to be a mixture of frequencies in which the useful signal has the absolute maximum amplitude, namely, greater than the threshold voltage $U_0$. When this input voltage $U_E$ is applied for example, the first comparator 2 changes its output state from "0" to "1." This means that the frequency of the useful signal lies in the pass-range between $f_1$ and $f_2$ of the first bandpass filter 1, and that the amplitude of the useful signal at the output of this bandpass filter is greater than the threshold voltage $U_0$ at the comparison input of the comparator 2. The comparator 2 will drop back again into its initial state ("0" at the output) when $U_1$ is less than $U_0$. Since $U_1$ is generally an alternating voltage, $U_2$ pulses with a width less than half the cycle-duration of $U_1$ appear at the output of the comparator 2. The $U_2$ pulses pass through the AND-gate 3, and set the single-shot flip-flop upwards ($U_4$ = "1", $\overline{U}_4$ = "0").

The set-reset flip-flop 5 is thus also set upwards ($U_5$ = "1"), whereby the analog gate 7 closes the by-pass between the bandpass filter 1 and the common output terminal (A). This analog gate 7 as well as 17 and 27 may comprise, in the simplest case, a relay with a "make" contact, whereby the voltage $U_5$ energizes the relay coil.

When any one of the by-pass conductors between a bandpass filter output and the output bus terminal (A) is closed, it must be assured that all other by-passes are blocked. Since the by-pass for the filter 1 is now closed or conducting, it is necessary to block the by passes from the bandpass filter 11 and from the bandpass filter 21 to the common output terminal (A). Such blocking must continue as long as the bandpass filter 1 is connected to the common output terminal (A). The AND-gates 13 and 23 accomplish such blocking. If the single-shot flip-flop 4 is set, its voltage $\overline{U}_4$ at the output ($\overline{Q}$) is equal to zero. Thus, the second input $E_2$ of the AND-gate 13 and the third input $E_3$ of the third AND-gate 23 are likewise "0". A $U_{12}$ or $U_{22}$ pulse thus could not pass both AND-gates while the output ($\overline{Q}$) of the single-shot flip-flop 4 is in the "0" state. However, the AND-condition is fulfilled at the AND-gate 3 when a $U_2$ pulse arrives, since the voltages $\overline{U}_{14}$ and $\overline{U}_{24}$ at the second and third inputs are equal to "1." The time during which the AND-gates 13 and 23 are "cut off" depends on the pulse duration of the retriggerable single-shot flip-flop 4. This pulse duration must be greater than a complete cycle of the edge, or lower limit frequency $f_1$ of the bandpass filter 1 in order to assure that a complete cycle of the voltage $U_1$ is transmitted to the common output (A). In order to avoid uncertainties in switching, this pulse duration is however made greater, e.g. by a factor of 2 to 3.

If the voltage $U_1$ has dropped below the threshold level $U_0$, the voltage path from the output of the bandpass filter 1 to the common output (A) remains closed, but the whole circuit arrangement is prepared by means of the OR-gate 6 to connect another bandpass filter to the common output (A). After the timing period of the single-shot flip-flop 4 has expired: $U_4$ = "0" and $\overline{U}_4$ = "1." If, for example, a $U_{12}$ pulse now appears, i.e. if the frequency of the useful signal lies in the pass range of the bandpass filter 11, and if the output voltage $U_{11}$ of this filter is greater than $U_0$, the AND-condition is fulfilled at the AND-gate 13, the $U_{12}$ pulse can pass the AND-gate 13 and therefore acts as a $U_{13}$ pulse to trigger the single-shot flip-flop 14 thus: $U_{14}$ = "1," $\overline{U}_{14}$ = "0." $\overline{U}_{14}$ blocks the AND-gates 3 and 23, $U_{14}$ acts through the OR-gates 6 and 26 to reset the set-reset flip-flops 5 and 25 back to zero — the latter naturally only if it was previously set. $U_{14}$ furthermore sets the set-reset flip-flop 15 ($U_{15}$ = "1") and thus closes the bypass between the bandpass filter 11 and the common output (A).

The example embodiment here described comprises three bandpass filters. If (n) bandpass filters are used, for example in order to increase the selectivity, a corresponding number of comparators, AND-gates, single-shot flip-flops, OR-gates, set-reset flip-flops, and analog gates will be provided. The AND-gates must then comprise (n) inputs, and the OR-gates (n−1) inputs. The AND-gates must then be connected in the following manner:

The (r-th) AND-gate must be connected with its first input to the output of the (r-th) comparator the output of which is connected to the input of the (r-th) single-shot flip-flop. The remaining AND-gate inputs are connected to the ($\bar{Q}$) outputs of the remaining (n-1) single-shot flip-flops.

The OR-gate must be connected as follows. The (r-th) OR-gate must be connected with its output to the (R) input of the (r-th) set-reset flip-flop, and its (n−1) inputs to the (Q) outputs of the other single-shot flip-flops with the exception of the (r-th) single-shot flip-flop.

Although the invention has been described with reference to specific example embodiments, it is to be understood that it is intended to cover all modifications and equivalents within the scope of the appended claims.

What is claimed is:

1. In an electrical filter circuit of the type having at least two bandpass filter means, each having an input and an output, means for connecting the inputs of the filter means in parallel to a signal source, each of said filter means having different pass characteristics and a separate signal path for selectively connecting the output of each filter means to an output circuit in response to a signal from said source, the improvement wherein each said signal path comprises comparator means for comparing the instantaneous amplitude of the output of the respective filter means with a reference amplitude, means responsive to said comparator means for producing an output voltage in the respective signal path when the output of the respective filter means exceeds the reference amplitude, means for blocking the signal path of the other filter means when the output voltage of the given signal path exceeds said reference amplitude, and for unblocking the signal path of the other filter means when the output voltage of the given signal path is below said reference amplitude.

2. The electrical filter circuit according to claim 1, wherein said plurality of bandpass filter means have such frequency bandwidths that the upper frequency of a preceeding bandpass filter means coincides with the lower frequency of a following bandpass filter means.

3. The electrical filter circuit according to claim 1, wherein each of said signal paths for each bandpass filter means comprises a logic circuit including said comparator means, an AND-gate, a single shot flip-flop, an OR-gate, a set-reset flip-flop, and an analog gate arranged in that order between the output of the respective bandpass filter means and said output circuit, and a by-pass conductor means connected in parallel to said logic circuit chain between the respective bandpass filter means and an input of said analog gate.

4. The electrical filter circuit according to claim 3, wherein each AND-gate in each of said signal paths comprises a number of inputs corresponding to said plurality of bandpass filter means.

5. The electrical filter circuit according to claim 3, wherein each OR-gate comprises a number of inputs corresponding to said plurality of bandpass filter means minus one.

6. The electrical filter circuit according to claim 3, wherein each single-shot flip-flop has a timing period which is longer than the cycle duration of the lower limit frequency of the respective bandpass filter means.

* * * * *